(12) United States Patent
Tailliet

(10) Patent No.: US 9,747,053 B1
(45) Date of Patent: Aug. 29, 2017

(54) APPARATUS AND METHOD FOR EEPROM SELECT TRANSISTOR BREAKDOWN VOLTAGE MANAGEMENT

(71) Applicant: STMicroelectronics (Rousset) SAS, Rousset (FR)

(72) Inventor: François Tailliet, Fuveau (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/221,343

(22) Filed: Jul. 27, 2016

(30) Foreign Application Priority Data

Feb. 18, 2016 (FR) ...................................... 16 51301

(51) Int. Cl.
*G11C 16/04* (2006.01)
*G06F 3/06* (2006.01)

(52) U.S. Cl.
CPC ............ *G06F 3/0625* (2013.01); *G06F 3/061* (2013.01); *G06F 3/0655* (2013.01); *G06F 3/0688* (2013.01)

(58) Field of Classification Search
CPC ...... G06F 3/0625; G06F 3/061; G06F 3/0655; G06F 3/0688
See application file for complete search history.

(56) References Cited

U.S. PATENT DOCUMENTS

| 5,999,455 | A | 12/1999 | Lin et al. | |
|---|---|---|---|---|
| 7,012,837 | B2* | 3/2006 | Naura | G11C 8/08 |
| | | | | 365/185.19 |
| 9,455,034 | B1* | 9/2016 | Tailliet | G11C 16/3459 |
| 9,583,193 | B2* | 2/2017 | Tailliet | G11C 16/0483 |
| 2011/0085385 | A1 | 4/2011 | Park et al. | |
| 2011/0096609 | A1 | 4/2011 | Lee et al. | |
| 2011/0170346 | A1* | 7/2011 | Nagai | G11C 11/5628 |
| | | | | 365/185.2 |
| 2013/0033934 | A1 | 2/2013 | Strenz et al. | |
| 2016/0148697 | A1 | 5/2016 | Tailliet et al. | |

FOREIGN PATENT DOCUMENTS

FR 3029000 A1 5/2016

* cited by examiner

*Primary Examiner* — Pho M Luu
(74) *Attorney, Agent, or Firm* — Slater Matsil, LLP

(57) ABSTRACT

A memory device of the non-volatile electrically-erasable and programmable memory type is provided. The memory device includes a matrix memory plane of memory cells connected to bit lines. Programming circuitry is configured to select a memory cell and to apply a programming pulse to the corresponding bit line. The memory plane is disposed in a local well at a floating potential and the programming circuitry is configured to increase the potential of the local well simultaneously with the application of the programming pulse to the bit line of a selected memory cell.

20 Claims, 6 Drawing Sheets

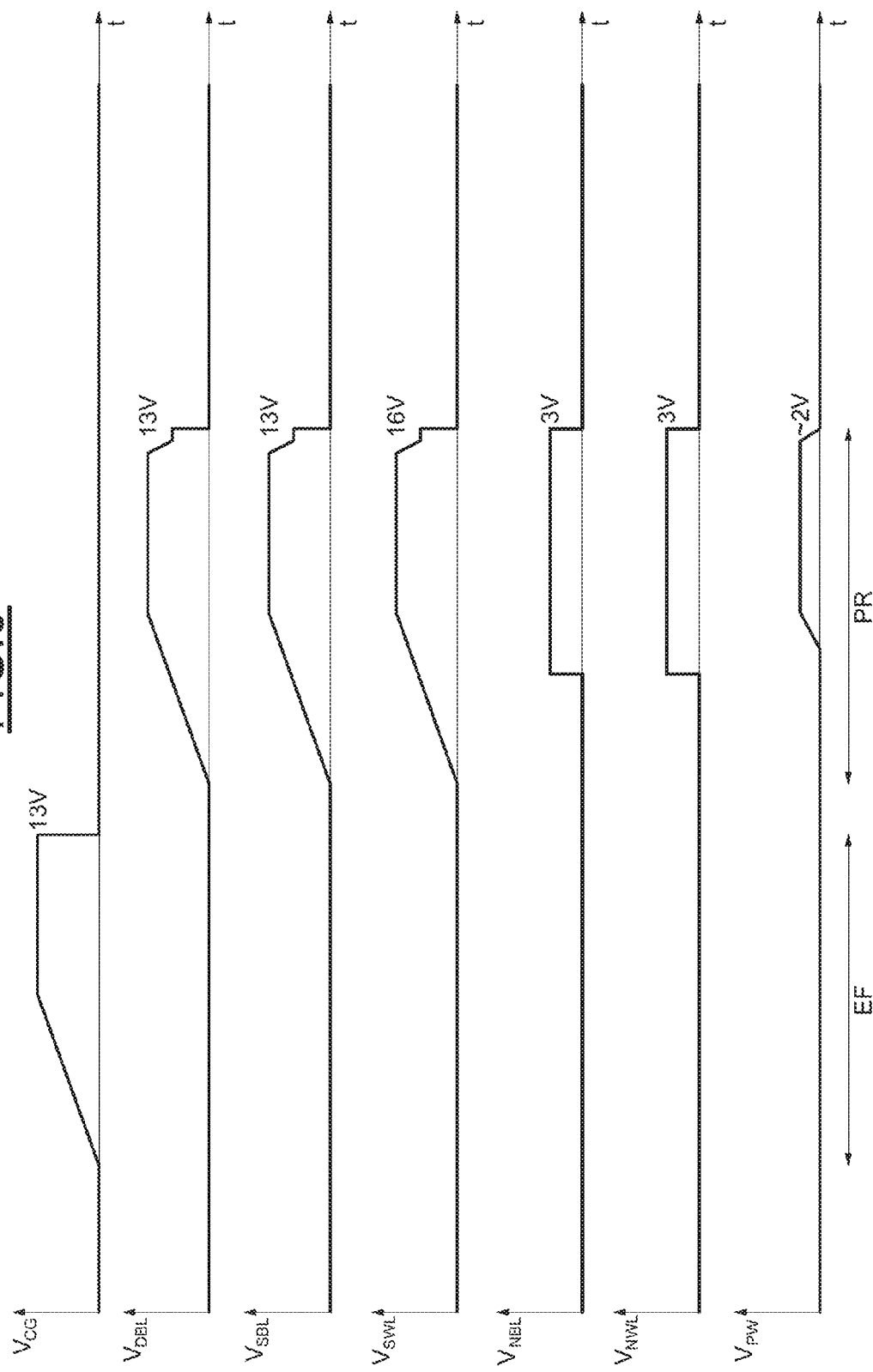

APPARATUS AND METHOD FOR EEPROM SELECT TRANSISTOR BREAKDOWN VOLTAGE MANAGEMENT

This application claims priority to French Patent Application No. 1651301, filed on Feb. 18, 2016, which application is hereby incorporated herein by reference.

TECHNICAL FIELD

Various embodiments of the invention relate to memories, in particular non-volatile memories of the electrically-erasable and programmable (EEPROM) type.

BACKGROUND

In EEPROM memories, the logical value of a bit is stored in a memory cell usually comprising an access transistor and a state transistor having a control gate and a floating gate.

The programming or the erasing of a floating-gate transistor consists in the injection or the extraction of electrical charges into or from the gate of the transistor by tunnel effect ("Fowler-Nordheim effect") by means of a high voltage pulse Vp which can be of the order of 10 to 20 volts, typically 13 volts.

This high voltage of 13 volts, necessary for writing EEPROM memories, cannot be reduced and imposes tight constraints with regard to the technological processes and the reliability of the product.

Indeed, lithographic reduction, in other words increasing the etch resolution, leads to a decrease in the operating voltages, and this high write voltage becomes more problematic notably with regard to breakdowns or leakages from the source/drain junctions of the transistors to the substrate generally connected to ground.

These risks of leakages and of premature aging of the transistors have a direct impact on the reliability of the product and the maximum high voltage Vp applicable is limited by the robustness of the memory cells.

As a consequence, the voltage Vp may be insufficient for the erase and programming operations to take place correctly or the memory cells may even be degraded.

Furthermore, when the voltage Vp comes close to the maximum voltages permitted for the components in question, large leakage currents appear, generally by the avalanche effect. These currents increase significantly above a certain threshold and a charge pump can no longer supply them. This may lead to an under-erasing or an under-programming, and these leakage risks thus have a direct impact on the functionality of the circuit Maximizing the coupling factor of the memory cells and minimizing the thickness of the tunnel oxide have allowed this problem to be addressed, but these techniques have reached their maximum possibilities (coupling factor exceeding 80% and thickness of tunnel oxide less than 70 Å).

An increase in the duration of application of the erase and programming high-voltage pulses is limited since this could lead to unacceptable write times.

Alternative solutions, such as for example an architecture known as a "split-voltage" architecture (according to terminology generally used by those skilled in the art) have been envisaged, but generally require complex peripheral circuits and are poorly adapted notably to small memory planes, consuming very little power, for example used in radio frequency identification ("RFID") tags or autonomous memories.

SUMMARY

Embodiments of the invention avoid breakdowns and leakages at the junctions of the memory cells while at the same time applying voltages that are sufficiently high for the erase and programming operations to take place correctly.

According to one embodiment, a memory architecture of the simple EEPROM memory type is provided, with no increase in surface area with respect to the known architectures, allowing the breakdown and the leakages of the memory cells to be avoided during efficient and reliable programming operations.

Thus, according to one aspect, a memory device of the non-volatile electrically-erasable and programmable memory type is provided, comprising a matrix memory plane of memory cells connected to bit lines, and programming circuitry configured for selecting a memory cell and applying a programming pulse onto the corresponding bit line.

According to a general feature of this aspect, the memory plane is situated within a local well at a floating potential and the programming circuitry is configured to increase the potential of the local well simultaneously with the application of the programming pulse to the bit line of a selected memory cell.

A local well at a floating potential is generally insulated from the substrate by other wells and a buried layer, of conductivity opposite to the conductivity of the local well and of the substrate.

By increasing the potential of the local well, the potential difference on the junctions formed by the local well and the source/drain regions of the access transistors is reduced, and it is thus possible to increase by the same amount the potential applied to the drains and sources without however reaching the breakdown voltage of the junctions.

Generally speaking, dummy structures are added to the functional structures, notably in order to avoid interrupting periodicities which can be detrimental for certain steps of fabrication of integrated circuits. In the case of an EEPROM memory, these dummy structures comprise dummy bit lines.

These dummy bit lines, usually unused but structurally present, are advantageously employed for increasing the potential of the local well.

More precisely, during a programming operation, a potential is advantageously applied to the dummy bit lines that is sufficient to make a reverse current flow in the local well, across a PN junction, and consequently to cause the potential of the local well to increase.

Thus, in other words, according to one embodiment, the device comprises at least one dummy bit line connected to the local well via a PN junction and the programming circuitry is advantageously configured for increasing the potential of the local well by making a reverse current flow in the PN junction.

According to one embodiment, the programming circuitry is configured to apply a minimum non-zero voltage to the bit lines of the unselected memory cells simultaneously with the application of the programming pulse to the bit line of a selected memory cell.

According to one embodiment, the programming circuitry is configured to bias the local well to a voltage lower than a ceiling voltage.

The ceiling voltage may be equal to the minimum non-zero voltage.

Advantageously, the device may be configured such that the local well is biased in a substantially spatially uniform manner.

Furthermore, the device may be configured such that the programming circuitry is able to force the potential of the local well to ground.

According to one embodiment, the device comprises control blocks for control gates, disposed outside of the local well at a floating potential, and electrical links connecting the control blocks to the control gates of the memory cells, while extending above at least some of the memory cells of the memory plane.

On this subject, those skilled in the art will be able to refer at their convenience to the French patent application no. 1461339 (U.S. counterpart Ser. No. 14/849,257, filed Sep. 9, 2015), the content of which is incorporated in the present patent application.

According to another aspect, a method is also provided for writing a data value into a memory cell of a memory plane of a memory of the read-only electrically-erasable and programmable memory type, comprising a programming step during which a programming pulse is applied to a selected bit line, and comprising, during the application of the pulse, an increase in the potential of a floating local well incorporating the memory plane.

These embodiments and their implementation allow the equivalent of an increase having the value of the ceiling voltage in the breakdown voltage of the source-well and drain-well junctions of the access transistors to be obtained. For example, this increase can have the value of the ceiling voltage.

This notably allows higher voltages to be applied to the bit lines and the thickness of the tunnel oxides of the floating gate transistors to be increased notably resulting in a better retention of the data, using a small device and for example for a device with a low power consumption.

Furthermore, the cell can operate with a reduced coupling factor, in other words having a lower surface area for coupling capacitance which leads to a more compact memory cell. Moreover, a reduced coupling factor generally leads to an improvement in the resilience of the memory cell, which can tolerate a greater number of erase/programming cycles.

Although the invention may advantageously be adapted to an EEPROM memory, it will be apparent to those skilled in the art that the invention may be adapted to other types of non-volatile memory, for example of the flash memory type.

BRIEF DESCRIPTION OF THE DRAWINGS

Other advantages and features of the invention will become apparent upon examining the detailed description of embodiments and their implementation, which should not be seen as limiting, and from the appended drawings in which:

FIGS. 1 to 6 schematically show embodiments of a memory device according to the invention and their implementations.

DETAILED DESCRIPTION OF ILLUSTRATIVE EMBODIMENTS

Figure 1:
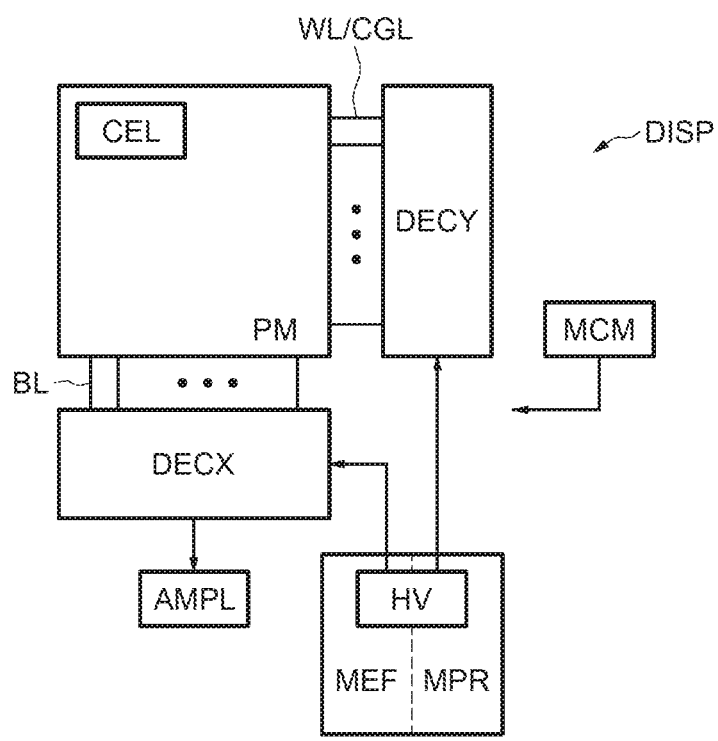

In FIG. 1, the reference DISP denotes one example of a memory device of the EEPROM type according to the invention.

This device DISP comprises a memory plane PM of memory cells CEL, together with programming circuitry MPR and erase circuit MEF notably comprising a circuit HV that allows a high programming or erase voltage to be applied. The device DISP also includes row and column decoders DECY and DECX together with read circuit comprising read amplifiers AMPL.

The row decoders DECY and column decoders DECX are notably controlled by the programming circuitry MPR and erase circuit MEF, and are configured to select a memory cell by respectively transmitting a signal over word and control lines WL/CGL and over bit lines BL, for example, using control blocks.

The device DIS also comprises a controller MCM comprising, for example, a logic circuit of conventional structure capable of enabling notably the programming circuitry MPR, erase circuit MEF, and read circuit AMPL.

Other conventional circuits present in the memory device DISP and not indispensible to the understanding of the invention have purposely not been shown in FIG. 1 for the sake of simplification.

Figure 2:
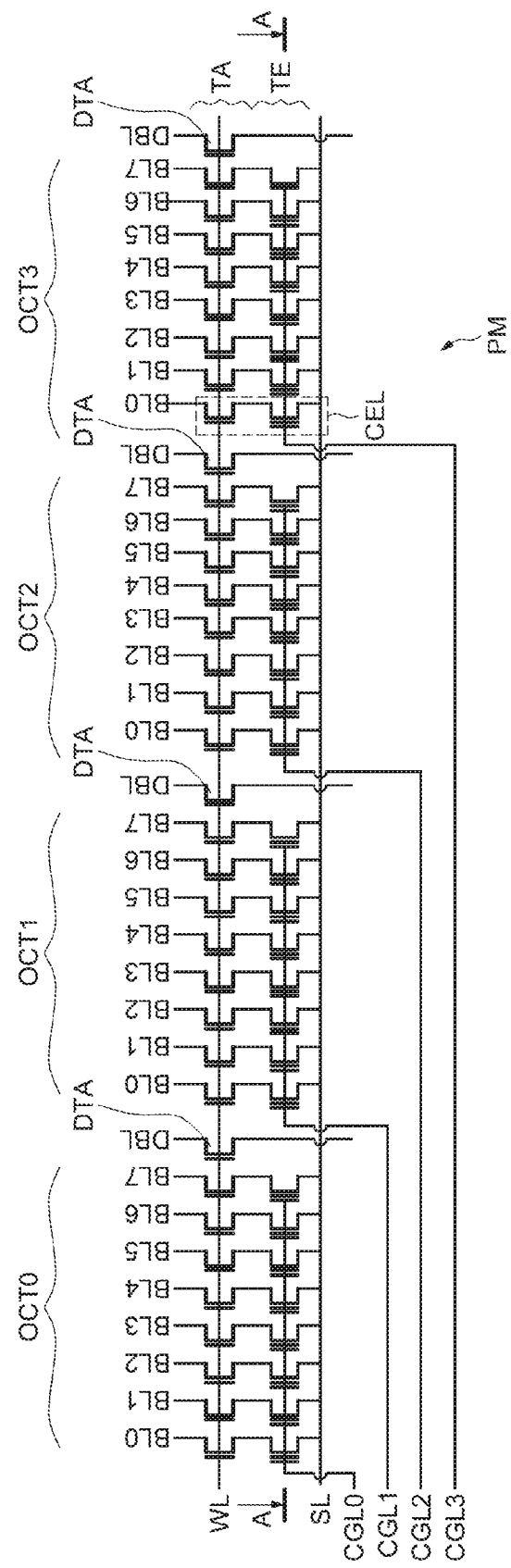

FIG. 2 shows more precisely an electronic circuit diagram of a portion of a memory plane PM comprising, in this representation, a memory word of 4 bytes OCT0 to OCT3 with eight memory cells CEL, controlled over a word line WL.

It is recalled here that a memory cell CEL of the EEPROM type comprises a floating gate state transistor TE conventionally having a control gate connected to a control line CGL (CGL here denoting any one of the control lines CGL0 to CGL3 common to the memory cells of the respective bytes OCT0 to OCT3), a floating gate, a drain region and a source region connected to a source line SL. Such a memory cell CEL also comprises an access transistor TA having a source region connected to the drain region of the state transistor TE, a drain region connected to a bit line BL (similarly, BL here denotes any one of the bit lines BL0 to BL7 of each byte OCT shown in FIG. 2), and a gate connected to a word line WL.

Furthermore, dummy bit lines DBL and dummy access transistors DTA are disposed between each byte OCT of the memory word. The source of each dummy access transistor DTA is common with the source of the dummy access transistor DTA of the next row.

These dummy structures are used for example during fabrication steps to avoid interruptions in periodicity, notably of the deposited materials, of the etches, or of the implantations, and are not typically used for the operation of the devices fabricated.

However, in the memory device according to the invention, use is advantageously made of the dummy structures during the steps for programming the device in operation.

Figure 3:
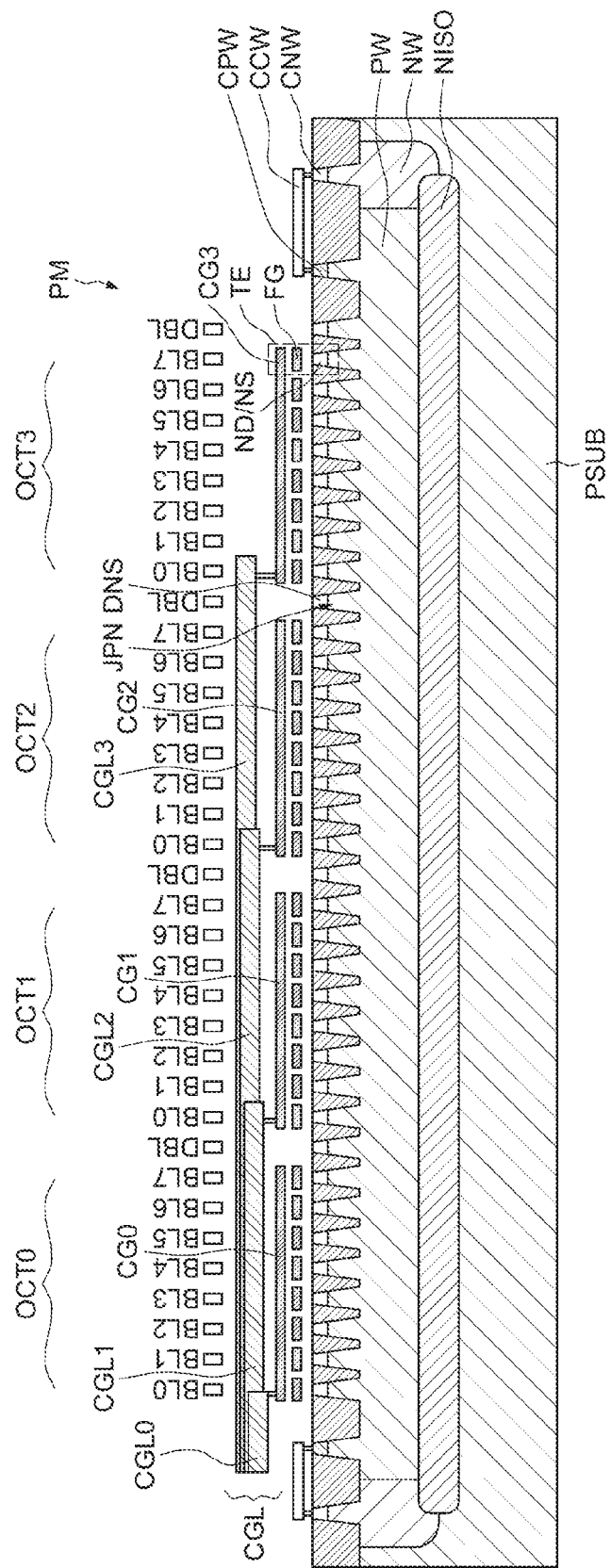

FIG. 3 shows a cross-sectional view of a memory plane PM of a device according to one embodiment, corresponding to the plane AA in FIG. 2.

The memory plane PM is formed in and on a semiconductor well PW, for example with P-type doping, electrically insulated from the remainder of the substrate PSUB with P-type doping by lateral wells NW and a buried layer NISO, with N-type doping.

The lateral wells NW are in contact with the buried layer NISO and comprise on their surface well contacts CNW, with N-type doping. The well PW also comprises well contacts CPW, with P-type doping, connected to the well contacts CNW by metal tracks CCW.

Thus, the potential of the whole assembly formed by the well PW, the lateral wells NW and the buried layer NISO, insulated from the substrate PSUB, is floating.

In the following part, for the sake of simplification, when "the potential of the local well PW" is mentioned, this in fact denotes the potential of the assembly.

This cross-sectional view shows the state transistors TE of the memory cells CEL, of which the control gate is referenced CG (CG denotes any one of the control gates CG0 to CG3 shown), the floating gate FG, and of which the drain region, formed by an implantation of dopants of the N type, is referenced ND.

The drain region ND of a state transistor TE may also represent the source region NS of the access transistor TA of the corresponding memory cell.

It may be noted in this figure that each byte OCT is separated from a neighboring byte by a separation region of the size of a memory cell CEL.

In the separation regions between two bytes, the dummy bit lines DBL are electrically connected by contacts to the drains DND of the dummy access transistors DTA but are not visible in the cross-sectional plane AA.

Nor are the connections of the bit lines BL to the drain regions of the access transistors TA visible in this representation.

The interfaces between the various doped regions of the device form PN junctions equivalent to diodes. In particular, the source regions of the dummy access transistors, with N-type doping, are denoted by the reference DNS and form a junction JPN with the local well PW with P-type doping.

The control gates of the state transistors with eight memory cells forming a byte OCT are represented in the form of a common control gate CG, connected to the corresponding control line CGL.

Figure 4:
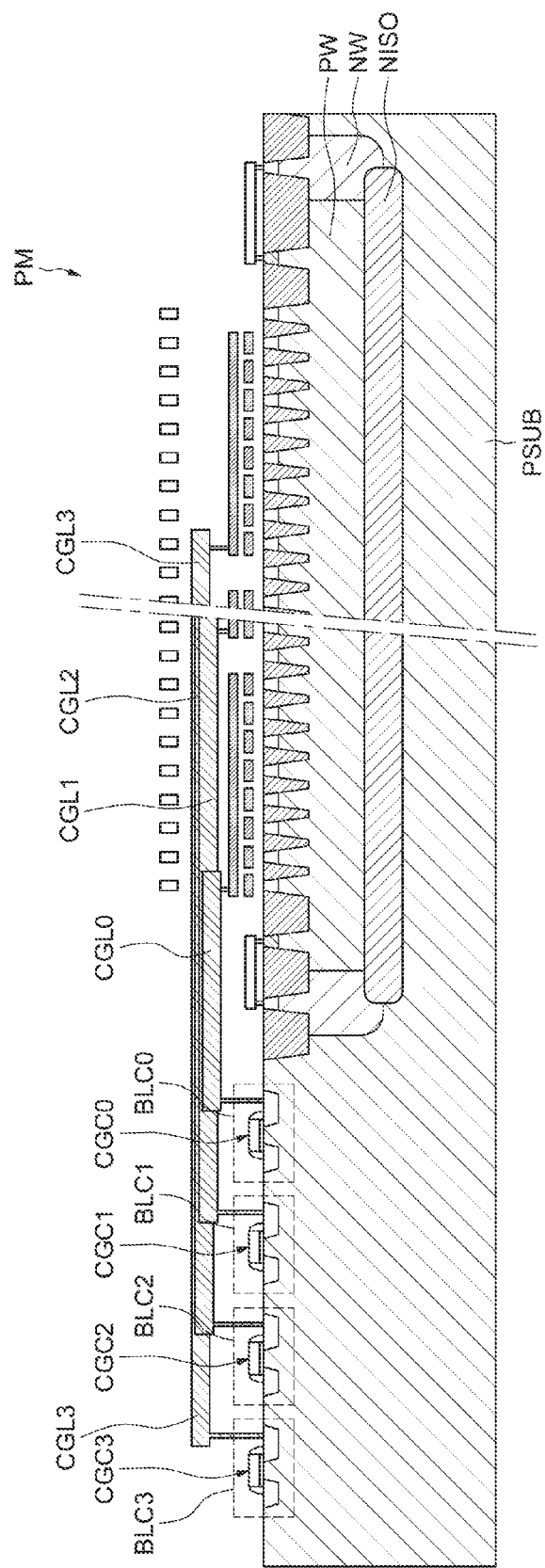

As shown in FIG. 4, also through the cross-sectional plane AA, the control lines CGL connect the memory cells CEL of the memory plane PM to control blocks BLC (BLC here denotes any one of the control blocks BLC0 to BLC3) situated outside of the memory plane PM. The same control block is associated with one byte.

The control blocks BLC comprise control elements, such as control gate switches CGC (CGC here denotes any one of the switches CGC0 to CGC3 corresponding to the blocks BLC0 to BLC3), represented in the form of a transistor, connected to the respective control gates CG via the respective control lines CGL.

Furthermore, the control blocks BLC may comprise for example latches or inverters.

Consequently, the control lines CGL are formed by metallizations that "fly over" the memory plane PM.

In this representation, the control blocks BLC are advantageously situated outside of the memory plane PM. However, the control blocks could be situated inside the memory plane PM, for example in second local wells with a fixed potential, isolated from the local well PW.

The voltages applied to the control lines CGL in an erase operation and to the bit lines BL in a programming operation are of the same order of magnitude, typically 13 volts. However, since the compactness constraints are less of an issue in the control blocks BLC, the elements of the control block, CGC1 to CGC3 for example, are not as limited in dimensions and may be formed so as to be able to intrinsically tolerate high voltages (for example, 13 volts).

Thus, the elements of the control block do not need to be in a local well at a floating potential in order not to be subject notably to leakages at their junctions.

Figure 5:
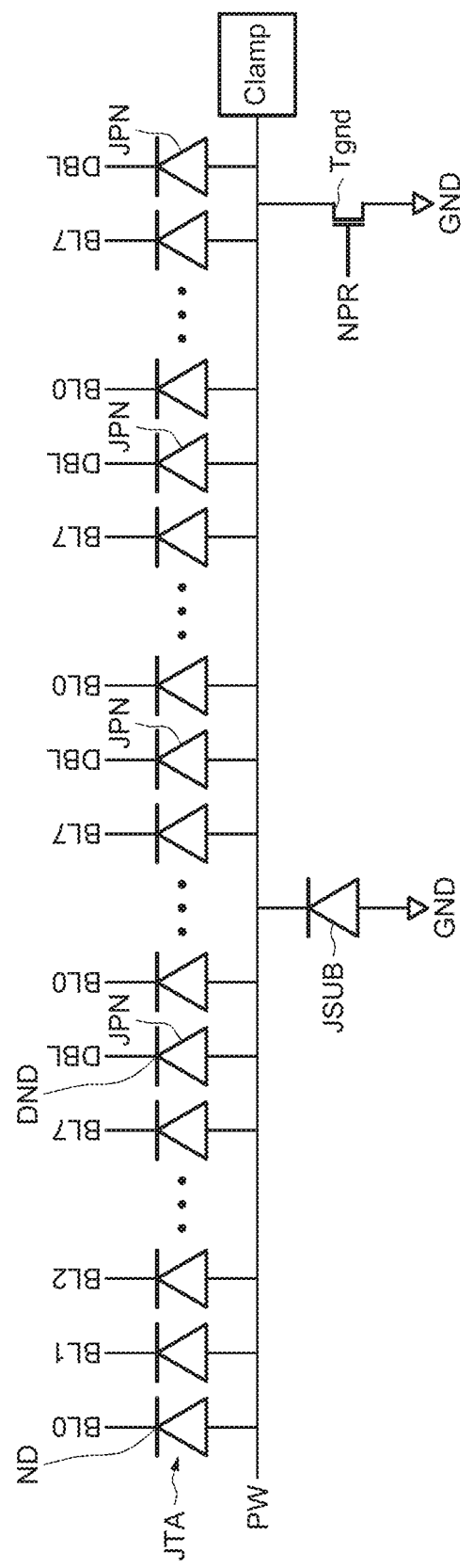

FIG. 5 shows an equivalent circuit for the PN junctions of a portion of a memory plane PM corresponding to the portion shown in FIGS. 2 and 3.

Each junction JTA between the drain regions of the N type of the access transistors TA and the local well at a floating potential PW of the P type is represented in the form of an equivalent diode. Similarly, the junctions JPN between the drain regions of the N type of the dummy access transistors DTA and the local well at a floating potential PW of the P type are represented in the form of an equivalent diode.

The drains ND and DND of the access transistors TA and of the dummy access transistors DTA are represented by the cathodes of the equivalent diodes JTE and JPN, the anodes, on the other hand, represent the local well at a floating potential PW.

The junction JSUB of the substrate, connected to ground GND, with the buried layer NISO and the lateral wells NW, forms an equivalent diode of which the anode is formed by the substrate PSUB and the cathode by the buried layer NISO and the lateral wells NW.

The diodes equivalent to the junctions JTA and JPN can also represent the junctions between the sources of the access transistors TA and of the dummy access transistors DTA with the local well PW, in the case where the transistors TA and DTA are in a conducting state.

Furthermore, the device shown comprises a transistor Tgnd connected between the local well PW and ground GND and controlled by a signal NPR, configured to force the potential of the local well PW to ground GND.

The device shown also comprises a block Clamp, which is used for limiting the biasing of the local well PW below a ceiling voltage. The block Clamp can comprise, for example, four transistors configured as a diode with a threshold voltage of 0.7V, connected in series to ground GND, allowing the potential of the local well to be limited to a ceiling voltage of around 3V.

FIG. 6 shows the voltages applied to the elements of the memory plane during a cycle for writing a data value into a memory cell CEL of the memory plane PM.

Conventionally, a cycle for writing a data value into a selected memory cell comprises an erase step EF preceding a programming step PR.

In the erase step EF, the erase means MEF are conventionally configured for coupling the drain and the source of the state transistor TE to ground GND and for applying to the control line CG an erase pulse at an erase voltage $V_{CG}$ having an erase value typically of around 13 volts.

In the step PR for programming a selected cell, the programming means MPR are configured for connecting the control lines CG to ground GND and for applying a programming pulse at a programming voltage $V_{SBL}$ to the selected bit line BL, typically of around 13 volts, and for rendering the access transistors TA conducting by applying a potential $V_{SWL}$ typically of 16 volts to the selected word line WL.

During the programming PR, the unselected bit lines and the unselected word lines are at respective potentials $V_{NBL}$ and $V_{NWL}$ which are non-zero but sufficiently low to avoid interference effects in the unselected memory cells, for example 3V.

Consequently, the potential in the drain and source regions of the access transistors TA of the selected memory cells is equal to the programming voltage $V_{SBL}$, and the voltage across the terminals of the junctions JTA may be higher than the breakdown voltage $V_{BD}$ of the junctions JTA.

Since the potential of the local well PW is floating, its potential $V_{PW}$ will increase when a reverse current flows in the case of a breakdown of the junctions JTA, up to a potential $V_{PW}$ substantially equal to the difference of the programming voltage and of the breakdown voltage ($V_{PW}=V_{SBL}-V_{BD}$). Since the potential $V_{PW}$ of the local well is increasing, the voltage across the terminals of the junctions JTA will decrease and fall below the breakdown voltage $V_{BD}$.

However, the number of selected cells, and hence of bit lines BL at a programming voltage $V_{SBL}$, is unpredictable from one write cycle to another, where no bit line BL might be selected during one cycle, and all might be selected during another.

Thus, too low a number of bit lines BL being selected may generate high reverse currents in the junctions JTA, which can cause them damage.

This is the reason for the dummy bit lines DBL being electrically biased at a voltage $V_{DBL}$ substantially equal to the programming voltage $V_{SBL}$, at each programming step PR, and irrespective of the number of bit lines BL selected, in order to increase the potential of the local well $V_{PW}$ by making a reverse current flow in the junctions JPN.

The potential $V_{PW}$ of the local well PW will naturally increase until an equilibrium is reached between the currents flowing in the junctions JTA and JPN and the currents flowing to ground GND in the junction JSUB.

Thus, with $V_{BD}$ the breakdown voltage of the junctions JTA and $V_{BW}$ the potential of the local well PW, the maximum voltage Vp applicable to a bit line, without causing any damage, is equal to $V_{BD}+V_{BW}$.

It is advantageous to limit the maximum potential of the local well PW by a ceiling voltage, which may for example be equal to the voltage $V_{NBL}$ applied to the bit lines not selected during the programming steps PR.

Advantageously, the potential of the local well PW is only floating during the programming steps PR of the write cycles, and is forced to ground GND the rest of the time.

Furthermore, a regular layout of the dummy bit lines DBL in the memory plane PM allows the local well PW to be biased in a substantially spatially uniform manner.

In conclusion, the embodiments of the device and their implementation allow the equivalent of an increase in the breakdown voltage $V_{BD}$ of the source-drain junctions of the access transistors of the memory plane, by the value of the ceiling voltage, without any significant modification to the architectures or to the usual dimensions of the memory devices of the EEPROM memory type.

What is claimed is:

1. A memory device of an electrically-erasable and programmable memory type, the memory device comprising:
    a matrix memory plane of memory cells disposed over a semiconductor substrate and connected to bit lines, wherein the memory plane is located in a local well at a floating potential, wherein the local well is isolated from the semiconductor substrate so as to define a floating region having the floating potential; and
    programming circuitry configured to select a memory cell and apply a programming pulse to a corresponding bit line, wherein the programming circuitry is also configured to increase the potential of the local well that is floating at the same time as applying the programming pulse to the bit line of a selected memory cell.

2. The device according to claim 1, further comprising a dummy bit line connected to the local well via a PN junction.

3. The device according to claim 2, wherein the programming circuitry is configured to increase the potential of the local well by causing a reverse current flow in the PN junction.

4. The device according to claim 1, wherein the programming circuitry is configured to apply a minimum non-zero voltage to the bit lines of unselected memory cells at the same time as applying the programming pulse to the bit line of the selected memory cell.

5. The device according to claim 1, wherein the programming circuitry is configured to bias the local well at a voltage lower than a ceiling voltage.

6. The device according to claim 1, wherein the programming circuitry is configured to apply a minimum non-zero voltage to the bit lines of unselected memory cells at the same time as applying the programming pulse to the bit line of the selected memory cell and is also configured to bias the local well at a voltage lower than the minimum non-zero voltage.

7. The device according to claim 1, wherein the device is configured so that the local well is biased in a substantially spatially uniform manner.

8. The device according to claim 1, wherein the device is configured so that the programming circuitry is so capable of forcing the potential of the local well to ground.

9. The device according to claim 1, further comprising control blocks disposed outside of the local well and electrical links connecting the control blocks to control gates of the memory cells, the electrical links running above at least some of the memory cells of the memory plane.

10. A method for writing a data value into a memory cell of a memory plane of a memory of an electrically-erasable and programmable read-only memory type, the method comprising:
    applying a programming pulse to a selected bit line, the memory plane being located in a local well biased at a floating potential, wherein the local well is disposed over a semiconductor substrate and is isolated from the semiconductor substrate so as to define a floating region having the floating potential; and
    simultaneously increasing the floating potential of the local well that incorporates the memory plane.

11. The method the method according to claim 10, wherein the memory further comprises a dummy bit line connected to the local well via a PN junction and wherein increasing the floating potential comprises causing a reverse current to flow in the PN junction.

12. The method the method according to claim 10, further comprising applying a minimum non-zero voltage to the bit lines of unselected memory cells at the same time as applying the programming pulse to the selected bit line.

13. The method the method according to claim 10, wherein the local well is biased at a voltage lower than a ceiling voltage.

14. The method the method according to claim 10, further comprising applying a minimum non-zero voltage to the bit lines of unselected memory cells at the same time as applying the programming pulse to the bit line of the selected bit line, wherein the local well is biased at a voltage lower than the minimum non-zero voltage.

15. The method the method according to claim 10, wherein the local well is biased in a substantially spatially uniform manner.

16. The method the method according to claim 10, further comprising forcing the potential of the local well to ground.

17. A memory device comprising:
    a memory plane of EEPROM memory cells arranged in rows and columns, the memory plane disposed in a local well biased at a floating potential, wherein the local well is disposed over a semiconductor substrate and is isolated from the semiconductor substrate so as to define a floating region having the floating potential;
    programming circuitry coupled to the memory plane;
    an erase circuit coupled to the memory plane;
    a row decoder coupled to bit lines of the memory plane;

column decoder coupled to word lines of the memory plane, wherein the row decoder and column decoder are coupled to the programming circuitry and the erase circuit;

a read circuit comprising a plurality of read amplifiers coupled to the row decoder; and a controller configured to enable the programming circuitry to cause a selected one of the memory cells to be programmed by applying a programming pulse to a selected bit line and simultaneously increasing the floating potential of the local well.

18. The device according to claim 17, further comprising a dummy bit line connected to the local well via a PN junction, wherein the programming circuitry is configured to increase the potential of the local well by causing a reverse current flow in the PN junction.

19. The device according to claim 17, wherein the device is configured so that the local well is biased in a substantially spatially uniform manner.

20. The device according to claim 17, further comprising control blocks disposed outside of the local well and electrical links connecting the control blocks to control gates of the memory cells, the electrical links running above at least some of the memory cells of the memory plane.

* * * * *